United States Patent [19]

McGarry

[11] Patent Number: 5,385,595
[45] Date of Patent: Jan. 31, 1995

[54] TITANIUM NITRIDE DIFFUSION BARRIER FOR PLATINUM-COATED FIBERGLASS SPINNER BORES

[75] Inventor: Dennis L. McGarry, Granville, Ohio

[73] Assignee: Owens-Corning Fiberglas Technology Inc., Summit, Ill.

[21] Appl. No.: 172,358

[22] Filed: Dec. 23, 1993

[51] Int. Cl.6 .............................................. C03B 37/04
[52] U.S. Cl. ....................................... 65/515; 65/493; 65/374.12
[58] Field of Search ..................... 65/1, 374.12, 26, 6, 65/7, 14, 15

[56] References Cited

U.S. PATENT DOCUMENTS

| | | | |
|---|---|---|---|
| 4,397,665 | 8/1983 | Harris | 65/374.12 |
| 4,404,009 | 9/1983 | Bhatti et al. | 65/1 |
| 4,511,383 | 4/1985 | Bhatti | 65/6 |
| 4,685,948 | 8/1987 | Kuribayashi et al. | 65/374.12 |
| 4,721,518 | 1/1988 | Monji et al. | |
| 5,171,348 | 12/1992 | Umetani et al. | 65/374.12 |

FOREIGN PATENT DOCUMENTS 1190266  4/1967  United Kingdom .

OTHER PUBLICATIONS

Johnson, D. C. "Platinum Coating Technique Developed for the Glass Industry" Sep. 1987 *Glass*.

Primary Examiner—Robert L. Lindsay
Attorney, Agent, or Firm—Ted C. Gillespie; Charles H. Ellerbrock

[57] ABSTRACT

A durable, corrosion-resistant fiberglass spinner is prepared by applying a uniform layer of titanium nitride to the bores of the spinner by chemical vapor deposition, and applying over the layer of titanium nitride a layer of platinum by transient liquid phase deposition.

19 Claims, No Drawings

TITANIUM NITRIDE DIFFUSION BARRIER FOR PLATINUM-COATED FIBERGLASS SPINNER BORES

FIELD OF THE INVENTION

This invention relates generally to the use of a titanium nitride diffusion barrier for platinum-coated fiberglass spinner bores. More particularly, the invention is directed to a method for applying a uniform layer of titanium nitride to the cylindrical surfaces of fiberglass spinner bores to act as a diffusion barrier, and applying thereover a uniform layer of platinum or other precious metal or alloy; and to the fiberglass spinners produced thereby.

BACKGROUND OF THE INVENTION

In certain industrial applications, such as the production of fiberglass wool for preparing thermal or acoustical insulation products, there is a need for metal alloys which possess certain characteristics such as high rupture strength, high corrosion resistance, and high oxidation resistance at elevated temperatures. In the fiberglass and mineral fibers industries, filaments which may be used for preparing such insulation products are produced by passing molten glass or mineral through the bores of the foraminous wall of a chamber which is adapted for rotation at high angular velocities (said chamber being known as a spinner). The filaments are extruded through the fiberizing bores due to the centrifugal action of the rotating spinner. Such spinners are typically operated at a temperature of about 2,050° F. and an angular velocity of about 2,050 RPM. It is advantageous, from a fiberglass production cost standpoint, for the angular velocity to be as high as possible so as to maximize the rate at which filaments are extruded through the fiberizing bores. However, high spinner angular velocities result in reduced spinner life due to the limited corrosion resistance of typical spinner base metal alloys. The flow of molten glass or mineral through the spinner bores corrodes the cylindrical walls of the bores causing them to enlarge, resulting in a loss of control of fiber diameter.

It is well-known in the fiberglass manufacturing art to apply a layer of platinum or other precious metal or alloy over the surfaces of base metal components which contact the molten glass, to reduce corrosion of the base metal alloy by the glass. However, when platinum is intimately bonded directly to the base metal alloy of, for example, a fiberglass spinner, an undesirable interdiffusion zone of complex intermetallic compounds forms near the interface between the precious metal layer and base metal alloy. This interdiffusion zone becomes brittle and porous, causing the precious metal layer to fail.

The bores of a fiberglass spinner are especially susceptible to corrosion caused by molten glass. Johnson, D.C. "Platinum Coating Technique Developed For The Glass Industry," Glass, September, 1987, page 372 discloses a method for applying a platinum coating to the surfaces of fiberglass spinner bores. The platinum is bonded directly to the spinner base metal alloy. However, it has been determined that such a platinum layer results in the interdiffusion phenomenon described hereinabove. The present inventor has discovered that base metal alloy atoms diffuse into the platinum layer leaving a porous base metal alloy structure immediately surrounding the annularly-shape platinum metal layer. Eventually, the bond between the base metal alloy and platinum layer fails, causing the platinum layer to sluff away from the cylindrical surface of the spinner bore.

U.S. Pat. No. 4,404,009 to Bhatti et al. discloses a fiberglass spinner having precious metal tubular inserts which are press-fit into the spinner bores. Such inserts could experience the same interdiffusion failure described above.

British Patent Specification No. 1,190,266 to Selman discloses a refractory metal spinning die coated with a layer of boron nitride or silicon nitride and overlaid with a platinum sheath. The platinum sheath is applied by fitting suitably shaped pieces of platinum over the article to be enclosed and then welding these pieces together so as to form a closely fitting sheath or covering for the base metal core. Such a method could not, however, be used to coat the bores of a fiberglass spinner.

U.S. Pat. No. 4,721,518 to Monji et al. discloses a press mold for forming glass optical lenses. The mold comprises a base metal alloy mold surface conforming to the desired lens shape, a barrier layer of titanium nitride applied by chemical vapor deposition, and a glass-contacting noble metal layer applied over the barrier layer by sputtering. However, the disclosed process employing sputtering could not be used to coat the cylindrical surfaces of fiberglass spinner bores which have diameters on the order of less than 1 millimeter.

It must be noted that the prior art referred to hereinabove has been collected and examined only in light of the present invention as a guide. It is not to be inferred that such diverse art would otherwise be assembled absent the motivation provided by the present invention, nor that the cited prior art when considered in combination suggests the present invention absent the teachings herein.

It would be desirable to coat the bores of a alloy metal base fiberglass spinner with a durable, corrosion-resistant layer of platinum or platinum alloy.

SUMMARY OF THE INVENTION

Accordant with the present invention, there surprisingly has been discovered a process for making a durable, corrosion-resistant fiberglass spinner, comprising:

A) providing a spinner, comprising a foraminous wall including a plurality of bores having substantially cylindrical surfaces;

B) applying by chemical vapor deposition a substantially uniform layer of titanium nitride to the surfaces of the bores; and C) applying by transient liquid phase deposition a substantially uniform layer of platinum to the layer of titanium nitride.

The invention further includes a fiberglass spinner, comprising:

A) a foraminous wall including a plurality of bores having substantially cylindrical surfaces;

B) a substantially uniform layer of titanium nitride adhered to the surfaces of the bores; and C) a substantially uniform layer of platinum adhered to the layer of titanium nitride.

The process of the present invention is particularly useful for manufacturing fiberglass spinners, to be used for the manufacture of fiberglass thermal or acoustical insulation products.

DETAILED DESCRIPTION OF THE PREFERRED EMBODIMENT

The invention is directed to a process for making a durable, corrosion-resistant fiberglass spinner, and to a spinner made thereby. The inventive spinner may be used to extrude glass or other molten mineral to produce fibers. By the term "fiberglass" as it is used herein is meant fibers of glass, slag, or other mineral material. The inventive spinner is durable, meaning that its bores resist corrosion due to contact with molten glass or other mineral material.

Fiberglass spinners are well-known in the art and comprise a generally cylindrical chamber which may be rotated at a high angular velocity. The periphery of the chamber is defined by a foraminous wall having a plurality (generally, from about a few hundred to about several thousand) of bores passing radially therethrough. The bores typically are less than one millimeter in diameter. Molten glass or other mineral material directed into the chamber is extruded through the bores in the foraminous wall upon rotation of the spinner. The bores are generally produced by laser drilling through the cylindrical wall of the chamber. The bores could likewise be formed by other conventional techniques such as, for example, mechanical drilling. Thus, the bores are substantially cylindrical in configuration. The spinners are generally made of a high rupture strength alloy containing chromium, nickel, and cobalt, as well as several other metals and/or refractory materials in small quantities. Typical spinners and spinner alloys are more fully set forth in U.S. Pat. Nos. 3,933,484 and 4,820,324 AND 4,877,435 which are incorporated herein in their entirety by reference thereto.

A substantially uniform layer of titanium nitride is applied to the surfaces of the bores by chemical vapor deposition; a process which produces conformal coatings that are not limited by the geometry of the surface as is the case for other coating processes such as magnetron sputtering or flame spraying. The titanium nitride layer may be produced by reacting a mixture of a titanium tetrahalide and a reducing agent at or near the surfaces of the bores. Typical concentrations of the mixed gases range from about 0.25 to about 10 mole percent titanium tetrahalide and about 2 to about 50 mole percent reducing agent; the balance being an inert carrier gas such as argon. Preferably, the range is from about 0.5 to about 3 mole percent titanium tetrahalide and about 3 to about 10 mole percent reducing agent. A preferred titanium tetrahalide comprises titanium tetrachloride and a preferred reducing agent comprises anhydrous ammonia. This step of the inventive process is generally conducted at a temperature from about 425° C. to about 750° C. The thickness of the titanium nitride layer which is effective as a diffusion barrier between the spinner base metal alloy and the platinum applied thereover is from about 5 microns to about 30 microns. Preferably, the thickness of the titanium nitride layer ranges from about 5 microns to about 15 microns. The titanium nitride layer is substantially uniform in that its thickness over the surfaces of the bores does not vary by more than about 20%.

Finally, a substantially uniform layer of platinum is applied to the layer of titanium nitride by transient liquid phase deposition. This process likewise produces substantially uniform thickness conformal coatings regardless of geometry. By the term "platinum" as the term is used here is meant pure platinum and alloys containing platinum; such as, for example platinum/rhodium or platinum/iridium alloys having platinum concentrations from about 99% to about 70% by weight.

Transient liquid phase deposition relies upon the phenomenon that certain alloying elements can substantially reduce the liquidus of platinum. Notable alloying elements include boron and silicon. A preferred alloying element comprises boron, at an atomic ratio of about 40% (approximately 3.55% by weight), which results in a melt temperature of about 830° C.

Transient liquid phase deposition of platinum may be achieved by applying a paste containing platinum and an alloying element to the surface of an article to be coated, and heating the coated article to deposit the platinum. The paste may be prepared by atomizing, for example, a platinum/boron alloy to form small alloy particles (preferably less than about 140 mesh), and mixing the alloy particles with an organic or water-based carrier such as acrylic acid/ethylmethacrylate co-polymer, a mixture of acrylic acid/ethylmethacrylate co-polymer and polyurethane, carboxymethyl cellulose, polyisobutylene, etc. A preferred paste containing a water-based carrier is NICROBRAZ S, manufactured by Walcolmonoy Company. The concentration of alloying element in combination with the platinum may vary over wide limits from greater than zero to about 40% by weight. Preferably the concentration ranges from greater than zero to about 30% by weight of the platinum/element alloy. The paste may comprise from about 30% to about 90% by weight alloy powder with the remainder being the organic carrier. Preferably, the alloy powder comprises from about 40% to about 60% by weight of the paste.

According to the present invention, the paste is applied to the titanium nitride coated spinner bores by rotating the spinner to fill the holes and intimately contact the titanium nitride layer. Once the paste has been applied to the spinner bores and dried, the spinner and applied paste is heated to liquify the alloy powder. In the case of a 3.55% by weight boron alloy, the spinner and applied paste are heated to a temperature from about 840° C. to about 860° C. for a period of about one hour. Thereafter the temperature is gradually raised to about 1,000° C. over a period of about an additional one hour period. It will readily be apparent to one ordinarily skilled in the art that the particular heat treatment used may vary considerably, depending upon the alloying element used, its concentration, the composition of the paste, etc. All heat treatments can be conducted either in a vacuum or in the presence of an inert gas such as argon. The thickness of the resulting platinum layer applied by transient liquid phase deposition which is effective to increase the durability and life of the spinner is from about 10 microns to about 50 microns. Preferably, the thickness of the platinum layer ranges from about 10 microns to about 30 microns.

It must be noted that the ingredients and process conditions described hereinabove for the chemical vapor deposition of titanium nitride and the transient liquid phase deposition of platinum are not sharply critical to the successful practice of the present invention. The reactants and reaction conditions recited are generally disclosed in terms of their broadest application to the practice of the invention. Occasionally, the ingredients or reactions as described may not be applicable to each embodiment included within the disclosed scope. Those compounds and reaction conditions for which this occurs will be readily recognizable by those ordinarily skilled in the art. In all such cases, either the reactions may be successfully performed by conventional modifications known to those ordinarily skilled in the art, e.g., by modifying heat treatment cycles, by changing to alternative conventional reagents, by routine modification of reaction conditions, etc., or other compounds or reaction conditions which are otherwise conventional will be applicable to the practice of the present invention.

What is claimed is:

1. A process for preparing a durable, corrosion-resistant fiberglass spinner, comprising:
   A) providing a spinner, comprising a foraminous wall including a plurality of bores having substantially cylindrical surfaces;
   B) applying by chemical vapor deposition a substantially uniform layer of titanium nitride to the surfaces of the bores; and
   C) applying by transient liquid phase deposition a substantially uniform layer of platinum to the layer of titanium nitride.

2. The process for preparing a durable, corrosion-resistant fiberglass spinner according to claim 1, wherein the chemical vapor deposition of titanium nitride comprises reacting a gas mixture comprising titanium tetrahalide and a reducing agent at or near the surfaces of the bores.

3. The process for preparing a durable, corrosion-resistant fiberglass spinner according to claim 2, wherein the gas mixture comprises from about 0.25 to about 10 mole percent titanium tetrahalide.

4. The process for preparing a durable, corrosion-resistant fiberglass spinner according to claim 2, wherein the titanium tetrahalide comprises titanium tetrachloride.

5. The process for preparing a durable, corrosion-resistant fiberglass spinner according to claim 2, wherein the gas mixture comprises from about 2 to about 50 mole percent reducing agent.

6. The process for preparing a durable, corrosion-resistant fiberglass spinner according to claim 2, wherein the reducing agent comprises anhydrous ammonia.

7. The process for preparing a durable, corrosion-resistant fiberglass spinner according to claim 2, wherein the reacting of the gas mixture is carried out at a temperature from about 425° C. to about 750° C.

8. The process for preparing a durable, corrosion-resistant fiberglass spinner according to claim 1, wherein the transient liquid phase deposition of platinum comprises intimately contacting the titanium nitride layer with a paste comprising a metal powder prepared from platinum and an alloying element, and a carrier, and heating the paste to liquify the metal powder.

9. The process for preparing a durable, corrosion-resistant fiberglass spinner according to claim 8, wherein the alloying element is selected from the group consisting of boron and silicon.

10. The process for preparing a durable, corrosion-resistant fiberglass spinner according to claim 8, wherein the alloying element comprises boron.

11. The process for preparing a durable, corrosion-resistant fiberglass spinner according to claim 8, wherein the concentration of the alloying element in the metal powder is from greater than zero to about 40% by weight.

12. The process for preparing a durable, corrosion-resistant fiberglass spinner according to claim 8, wherein the heating comprises raising the temperature to between about 840° C. and about 860° C. for a period of about 1 hour, gradually raising the temperature to about 1,000° C. over a period of about 1 hour, and maintaining a temperature of about 1,000° C. for about 1 hour.

13. A process for preparing a durable, corrosion-resistant fiberglass spinner, comprising:
   A) providing a spinner, comprising a foraminous wall including a plurality of bores having substantially cylindrical surfaces;
   B) applying a substantially uniform layer of titanium nitride to the surfaces of the bores, by reacting a gas mixture comprising from about 0.5 to about 3 mole percent titanium tetrachloride and from about 3 to about 10 mole percent anhydrous ammonia, the balance being an inert carrier gas, at a temperature from about 425° C. to about 750° C. at or near the surfaces of the bores; and
   C) applying a substantially uniform layer of platinum to the layer of titanium nitride, by intimately contacting the titanium nitride layer with a paste comprising a metal powder prepared from platinum and from greater than zero to about 30% percent by weight boron, and a carrier, raising the temperature of the paste to between about 840° C. and about 860° C. for a period of about 1 hour, gradually raising the temperature to about 1,000° C. over a period of about 1 hour, and maintaining a temperature of about 1,000° C. for about 1 hour.

14. A durable, corrosion-resistant fiberglass spinner, comprising:
   A) a foraminous wall including a plurality of bores having substantially cylindrical surfaces;
   B) a substantially uniform layer of titanium nitride adhered to the surfaces of the bores; and
   C) a substantially uniform layer of platinum adhered to the layer of titanium nitride.

15. The durable, corrosion-resistant fiberglass spinner according to claim 14, wherein the thickness of the titanium nitride layer is from about 5 microns to about 30 microns.

16. The durable, corrosion-resistant fiberglass spinner according to claim 14, wherein the thickness of the platinum layer is from about 10 microns to about 50 microns.

17. The durable, corrosion-resistant fiberglass spinner according to claim 14, wherein the platinum is an alloy selected from the group consisting of platinum/rhodium and platinum/iridium wherein the platinum is present in a concentration from about 70% to about 99% by weight.

18. A durable, corrosion-resistant fiberglass spinner prepared by the process of claim 1.

19. A durable, corrosion-resistant fiberglass spinner prepared by the process of claim 13.

* * * * *